(12) United States Patent
Baek et al.

(10) Patent No.: US 8,344,346 B2
(45) Date of Patent: Jan. 1, 2013

(54) SEMICONDUCTOR DEVICE HAVING RESISTIVE DEVICE

(75) Inventors: Seung Beom Baek, Ichon-si (KR); Ja Chun Ku, Ichon-si (KR); Young Ho Lee, Ichon-si (KR); Jin Hyock Kim, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/073,521

(22) Filed: Mar. 28, 2011

(65) Prior Publication Data

US 2012/0153247 A1    Jun. 21, 2012

(30) Foreign Application Priority Data

Dec. 15, 2010  (KR) .................. 10-2010-0128007

(51) Int. Cl.
*H01L 29/02* (2006.01)
*H01L 29/06* (2006.01)
*G11C 11/00* (2006.01)

(52) U.S. Cl. ... 257/2; 257/5; 257/E29.33; 257/E45.002; 365/148

(58) Field of Classification Search .................. 257/2, 4, 257/5, E29.33, E45.002; 365/148, 151, 163
See application file for complete search history.

(56) References Cited

U.S. PATENT DOCUMENTS

| 2006/0249753 A1* | 11/2006 | Herner et al. .................. 257/202 |
| 2008/0112209 A1 | 5/2008 | Cho et al. |
| 2010/0178729 A1* | 7/2010 | Yoon et al. ..................... 438/104 |
| 2010/0288995 A1* | 11/2010 | Ozawa et al. ..................... 257/4 |

FOREIGN PATENT DOCUMENTS

| KR | 1020040039493 | 5/2004 |
| KR | 1020040041337 | 5/2004 |
| KR | 1020090015226 | 2/2009 |

* cited by examiner

*Primary Examiner* — Matthew Reames
*Assistant Examiner* — Nikolay Yushin
(74) *Attorney, Agent, or Firm* — IP & T Group LLP (57) ABSTRACT

A semiconductor memory device includes a plurality of word lines vertically formed on a surface of a semiconductor substrate, where each pair of the plurality of word lines form a set of word lines, a bit line formed parallel to the surface of the semiconductor substrate and disposed in plurality stacked between the word lines of each pair constituting the one set of word lines, and unit memory cells disposed between respective ones of the bit lines and an adjacent one of the pair of word lines of said one of the word line sets.

15 Claims, 10 Drawing Sheets

SEMICONDUCTOR DEVICE HAVING RESISTIVE DEVICE

CROSS-REFERENCES TO RELATED APPLICATION

The present application claims priority under 35 U.S.C. 119(a) to Korean application number 10-2010-0128007, filed on Dec. 15, 2010, in the Korean Patent Office, which is incorporated by reference in its entirety as if set forth in full.

BACKGROUND OF THE INVENTION

1. Technical Field

Exemplary embodiments of the present invention relate to a semiconductor memory device and, more particularly, to a semiconductor memory device having a resistive element.

2. Related Art

As mobile communication and digital storage technologies rapidly advance, conventional electron charge control-based devices are reaching their performance limits. Thus, different types of memory devices are being developed to overcome performance limits of conventional electron charge devices. For example, next generation memory devices with high capacity, ultra-high speed, and ultra-low power are being developed to satisfy requirements for advanced mobile communication and digital storage devices.

More specifically, resistive memories using a resistive element as a memory medium such as phase-change memory devices are being developed. Phase-change memory devices often use a phase-change material as a resistive medium, where a phase-change material switches between a crystalline state and an amorphous state in response to heat. As the phase-change material, a chalcogenide (GST)-based material which is a compound of germanium (Ge), antimony (Sb) and tellurium (Te) may be used.

A source for providing heat to a phase-change material may be current, where an amount of heat applied to the phase-change material depends on the intensity of the supplied current and the time that the current is supplied. The phase-change material has a resistance that varies according to a crystalline state thereof so that logic information is determined by a resistance difference between different states.

In developing phase-change memory devices, increasing the integration degree and the area of memory devices is useful. However, due to technical limits associates with use of a light source, reduction in a minimum feature size is difficult.

SUMMARY

According to one aspect of an exemplary embodiment, a semiconductor memory device includes a plurality of word lines vertically formed on a surface of a semiconductor substrate, wherein each pair of the plurality of word lines form a set of word lines and configured a pair of word lines as one set, a plurality of bit lines formed in parallel to the surface of the semiconductor substrate, wherein the bit lines are and disposed in plurality stacked over one another between the pair of word lines of one of the word line sets, and a unit memory cells disposed between respective ones of the bit lines and an adjacent one of the pair of word lines of said one of the word line sets.

According to another aspect of another exemplary embodiment, a semiconductor memory device includes a pair of word lines vertically formed on extending to a surface of a semiconductor substrate, a plurality of bit lines disposed parallel to the surface of the semiconductor substrate, wherein the bit lines are equally spaced from each other and stacked on one another and disposed at a constant distance between the a pair of the word lines to be stacked, first unit memory cells formed between respective bit lines and a word line of the pair of word lines, and second unit memory cells formed between respective bit lines and each bit line and the other word line of the pair of word lines. The first unit memory cells and the second unit memory cells are formed in a direction which are elongated in parallel to the surface of the semiconductor substrate and is perpendicular to each the respective bit lines.

According to another aspect of another exemplary embodiment, a semiconductor memory device includes three word lines vertically formed on extended to a surface of a semiconductor substrate and being spaced apart equally, a plurality of bit lines disposed parallel to the surface of the semiconductor substrate, wherein the bit lines are equally spaced from each other and disposed between a pair of the word lines and stacked over one another in spaces between a respective pair of the word lines, first unit memory cells formed between respective bit lines and a respective one of the word lines, and a second unit memory cells formed between each respective bit lines and another one of the other word lines. The first and second unit memory cells are elongated in formed in a direction which is parallel to the surface of the semiconductor substrate and perpendicular to each the respective bit lines. Each of the first and second unit memory cells includes a switching device electrically connected to each the respective bit line and a resistive device layer electrically connected to the respective word line.

These and other features, aspects, and embodiments are described below in the section entitled "DESCRIPTION OF EXEMPLARY EMBODIMENT".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EXEMPLARY EMBODIMENT

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Figure 1:
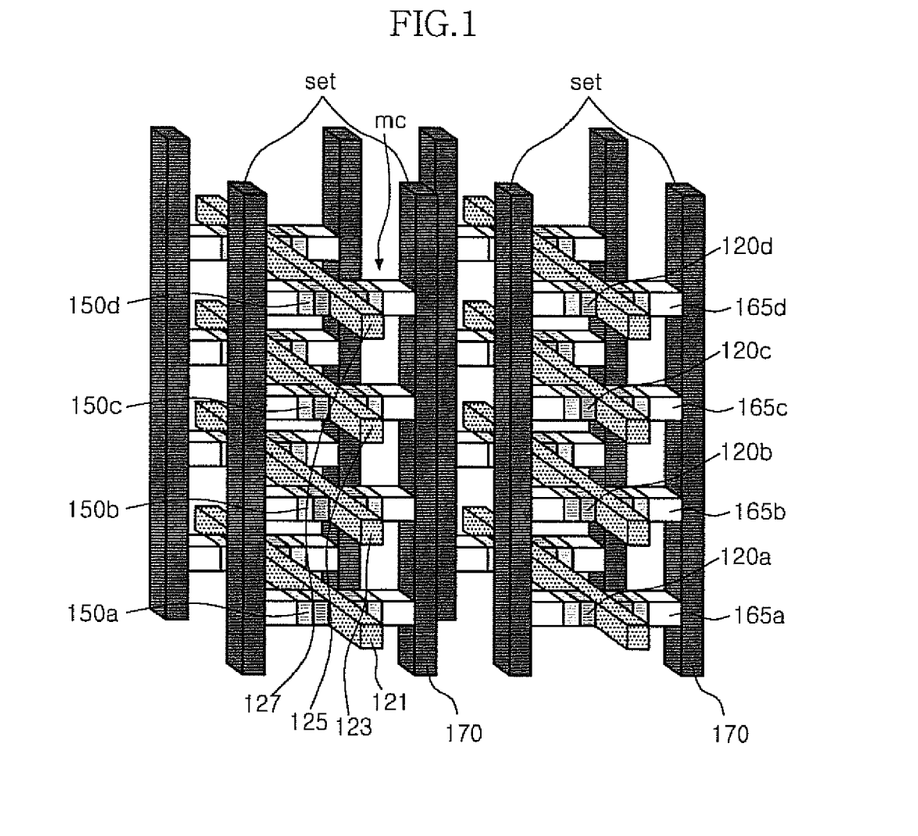
FIG. 1 is a perspective view illustrating a semiconductor memory device according to an exemplary embodiment.
Figure 2:
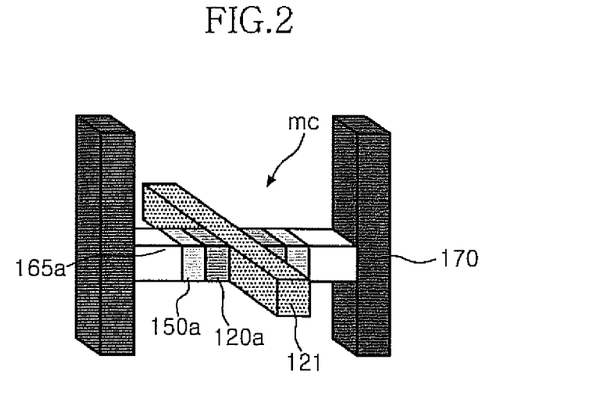
FIG. 2 is an enlarged perspective view illustrating a unit memory cell of FIG. 1.

FIG. 1 is a perspective view of a semiconductor memory device according to an exemplary embodiment, and FIG. 2 is a perspective view illustrating a unit cell structure for each layer.

Referring to FIG. 1, a semiconductor memory device includes a plurality of word lines 170 which extend in a direction perpendicular to a surface of a semiconductor substrate (not shown) and are disposed to be configured as a set of word lines. According to an example, a "set" of word lines include a pair of word lines that are adjacent and parallel to each other. According to an example, a set of word lines may form a row in which memory cells are to be formed.

A plurality of bit lines 121, 123, 125 and 127 are disposed between a pair of word lines 170 constituting a set and extend in a direction parallel to the surface of the semiconductor substrate to be stacked. The plurality of bit lines 121, 123, 125 and 127 disposed between a set (that is, a pair) of word lines 170 may overlap at the same position between the pair of word lines of the set but are electrically insulated from each other by interposing an insulating layer therebetween. Pairs of word lines 170 that each constitute a set may be continuously disposed with a constant spacing between the pairs along a direction that the plurality of bit lines 121, 123, 125, and 127 extend.

A plurality of unit memory cells mc are formed between a pair of word lines 170 and the bit lines 121, 123, 125 and 127 are stacked between the pair of word lines 170.

In reference to FIG. 2, unit memory cells mc are formed between the bit line 121 and a pair of word lines 170, respectively. Here, two unit memory cells mc are formed to share one bit line 121. A unit memory cell mc may be disposed on a first layer (on a base insulating layer). The unit memory cell mc includes a first switching layer 120a, a second switching layer 150a and a resistive device layer 165a. The first switching layer 120a is formed so that one side of the first switching layer 120a is in contact with the bit line 121. According to an example, the first switching layer 120a may include a polysilicon layer having a first conductivity. Here, when the bit line 121 is formed of a metal material, a schottky diode is formed by a schottky junction between the first switching layer 120a and the bit line 121.

The second switching layer 150a is formed to contact a sidewall of the first switching layer 120a and the resistive device layer 165a, where the resistive device layer 165a in turn forms a resistive element between a sidewall of the second switching layer 150a and adjacent word line 170. A plurality of unit memory cell mc may overlap in the same position between a pair of word lines 170 similarly to the plurality of bit lines.

According to an exemplary embodiment, a semiconductor memory device may be formed, where word lines extend in a direction perpendicular to a surface plane of the semiconductor substrate and bit lines and unit memory cells are disposed parallel to the surface plane of the semiconductor substrate and form stacks in a direction of the word lines extend (that is, a direction perpendicular to the surface plane of the semiconductor substrate). Since an integration density of memory cells may be adjusted by controlling a number of stacked layers within a designated area, the integration degree of memory cells can easily be controlled.

Hereinafter, a method of fabricating a semiconductor memory device will be described with reference to FIGS. 3A to 3D and 4A to 4D.

FIGS. 3A to 3D are plan views illustrating a method of fabricating the semiconductor memory device according to an exemplary embodiment. FIGS. 4A to 4D are cross-sectional views illustrating a method of fabricating the semiconductor memory device according to an exemplary embodiment.

Figure 3A:
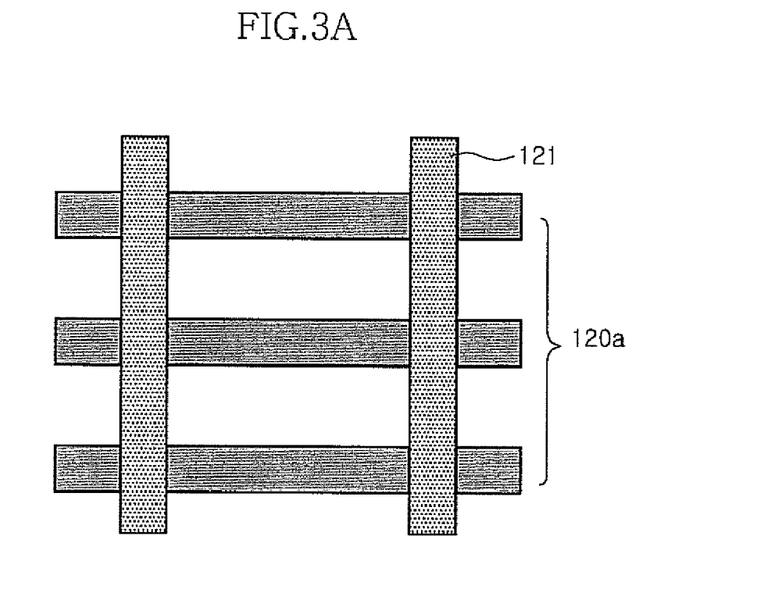
FIGS. 3A to 3D are plan views illustrating a method of a semiconductor memory device according to an exemplary embodiment.
Figure 4A:
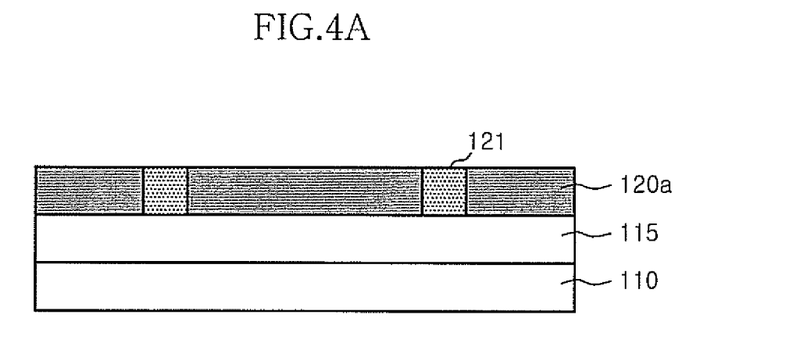
FIGS. 4A to 4D are cross-sectional views illustrating a method of a semiconductor memory device according to an exemplary embodiment.

Referring to FIGS. 3A and 4A, a base insulating layer 115 is formed on a semiconductor substrate 110, and a first switching layer 120a of a line type is formed on the base insulating layer 115. At this time, the first switching layer 120a may be formed in a plurality of stripe patterns (not shown) and the first switching layers 120a formed in the plurality of stripe patterns may be parallel to each other. In addition, the first switching layer 120a may, for example, be a polysilicon layer including a first conductivity impurity.

A plurality of first bit lines 121 are disposed on the base insulating layer 115 and cross the first switching layer 120a. The plurality of first bit lines 121 may be parallel to each other, formed of a metal material, and formed as a structure buried in the first switching layer 120a. Here, upper surfaces of the first switching layers 120a and an upper surface of the first bit line 121 may be disposed to be on the same plane. Thus, the first switching layer 120a crossed with the first bit line 121 is formed.

Figure 3B:
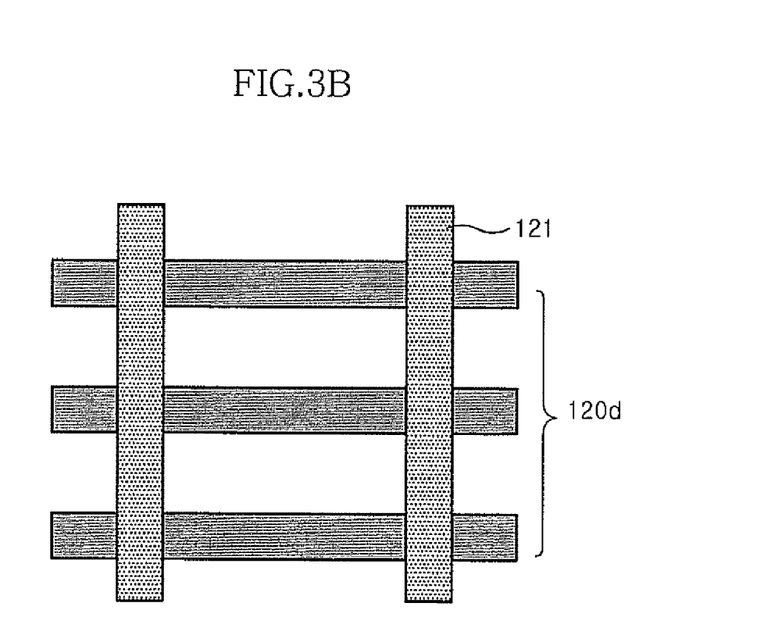
Figure 4B:
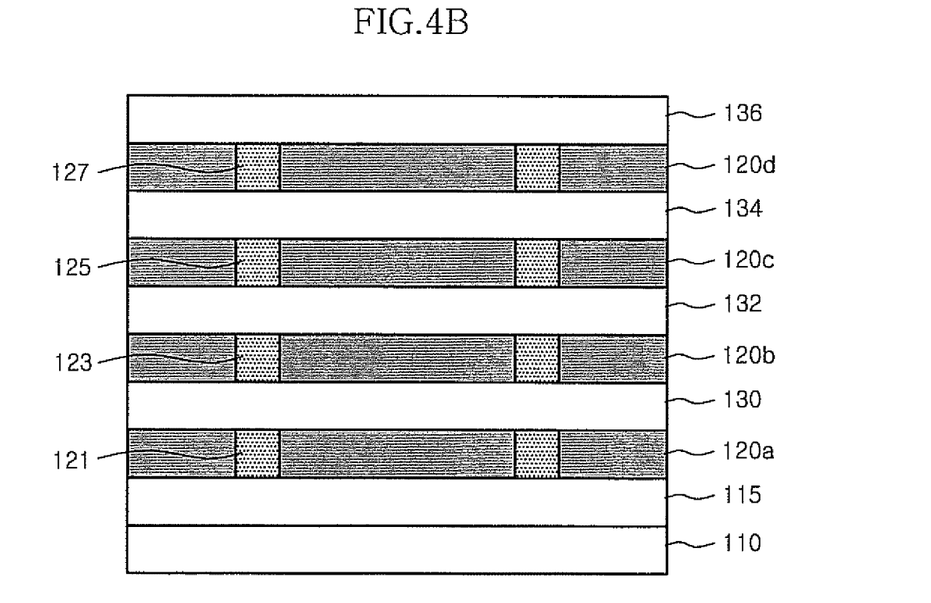

Referring to FIGS. 3B and 4B, a first interlayer insulating layer 130, a first switching layer 120b including a second bit line 123, a second interlayer insulating layer 132, a first switching layer 120c including a third bit line 125, a third interlayer insulating layer 134, a first switching layer 120d including a fourth bit line 127, and a fourth interlayer insulating layer 136 are sequentially stacked on the semiconductor substrate 110, where the first switching layer 120a including the first bit line 121 is formed on the semiconductor substrate 110.

The stacked first switching layers 120b, 120c and 120d have the same configuration as the first switching layer 120a and are stacked over another. Thus, the first and fourth bit lines 121, 123, 125 and 127 may be formed to overlap with each other in the same position between a set of word lines and are separated from each other by respective interlayer insulating layers 130, 132, 134 and 136.

Figure 3C:
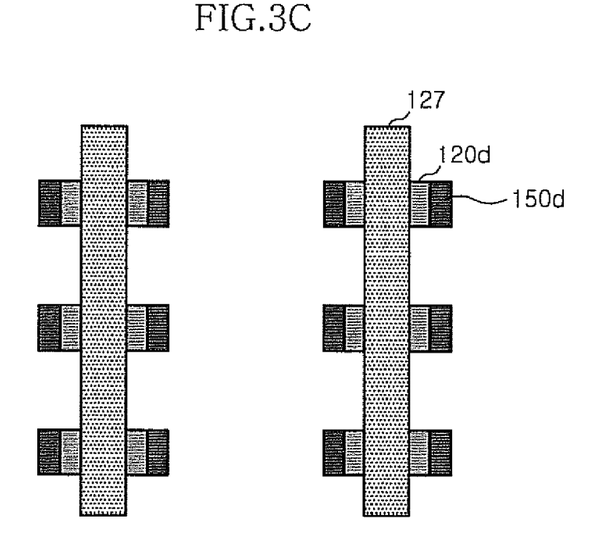
Figure 4C:
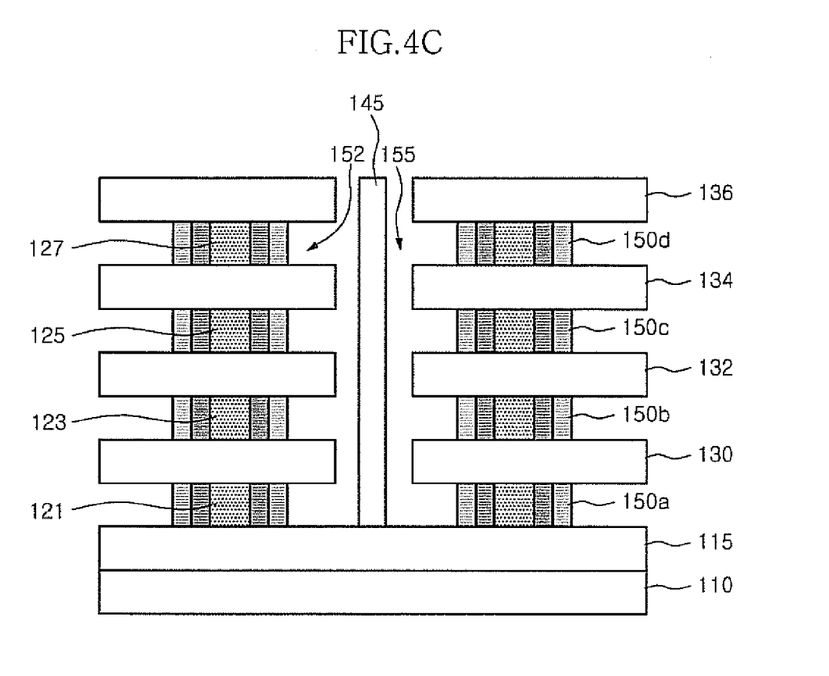

Referring to FIGS. 3C and 4C, a stacking structure is patterned to form a plurality of column structures (for example, 140 in FIG. 4D) so that the stacked first to fourth bit lines 121, 123, 125 and 127 are electrically separated by respective interlayer insulating layers 130, 132, 134 and 136. The column structures 140 may have a constant spacing between them in a direction perpendicular to a plane of the substrate 110, where a supporting pattern 145, the first switching layers 120a, 120b, 120c and 120d, and the interlayer insulating layers 130, 132, 134 and 136 may remain between the column structures 140.

Each of column structures 140 may include the stacked first to fourth bit lines 121, 123, 125, and 127, the first switching layers 120a, 120b, 120c and 120d remaining on both sides of the first to fourth bit lines 121, 123, 125 and 127, and the interlayer insulating layers 130, 132, 134 and 136 disposed on and below the first and fourth bit lines 121, 123, 125 and 127. Here, the first switching layers 120a, 120b, 120c and 120d are recessed so that the first switching layers 120a, 120b, 120c and 120d are inwardly disposed from sidewalls of the interlayer insulating layers 130, 132, 134 and 136. The recess process may be performed by an overetching process. In addition, second switching layers 150a, 150b, 150c and 150d are formed on outer sidewalls of the first switching layers 120a, 120b, 120c and 120d. The second switching layers 150a, 150b, 150c and 150d may be formed of a polysilicon layer having a second conductivity type, where the second conductivity type is opposite to the first conductivity type of the first polysilicon layer used for forming the first switching layers 120a, 120b, 120c and 120d. At this time, the second switching layers 150a, 150b, 150c and 150d may be also formed to be disposed inwardly from the sidewalls of the interlayer insulating layers 130, 132, 134 and 136 constituting of the column structure 140. Here, the reference numeral 152 denotes a space (hereinafter, referred to as a first space) between the interlayer insulating layers 130, 132, 134 and 136. The reference numeral 155 denotes a space (hereinafter, referred to as a second space) between the column structure 140 and the supporting pattern 145.

Figure 3D:
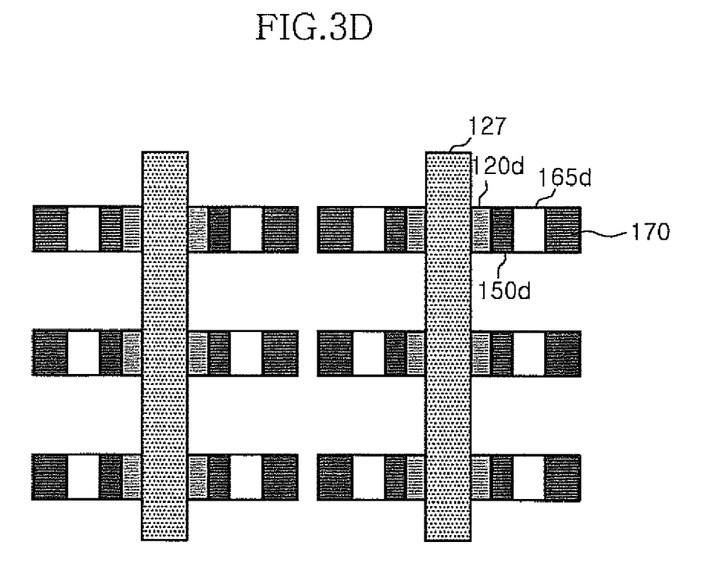
Figure 4D:
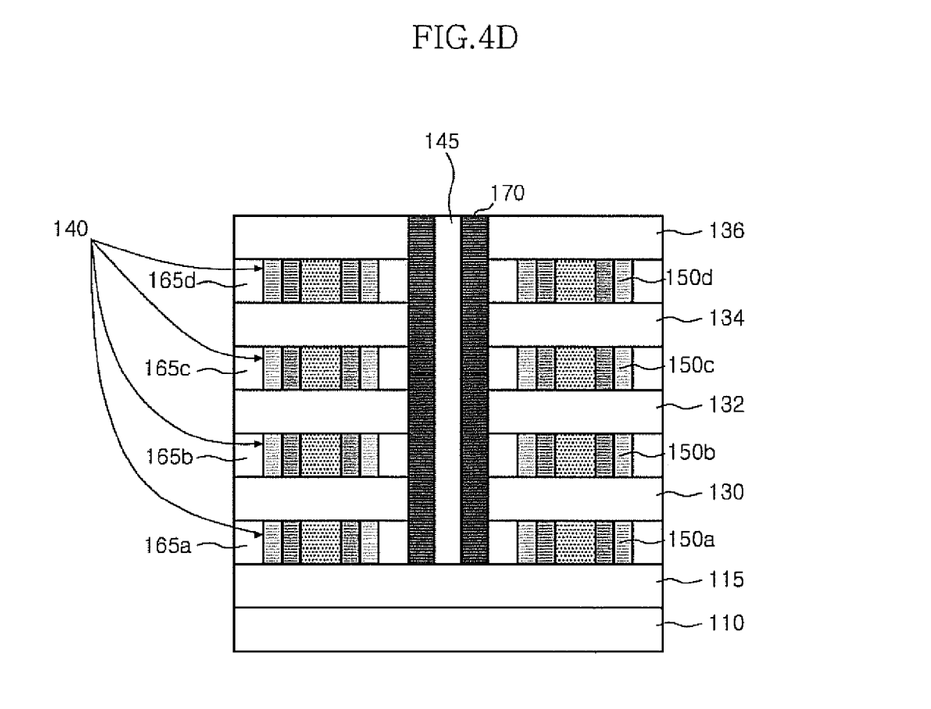
Figure 5:
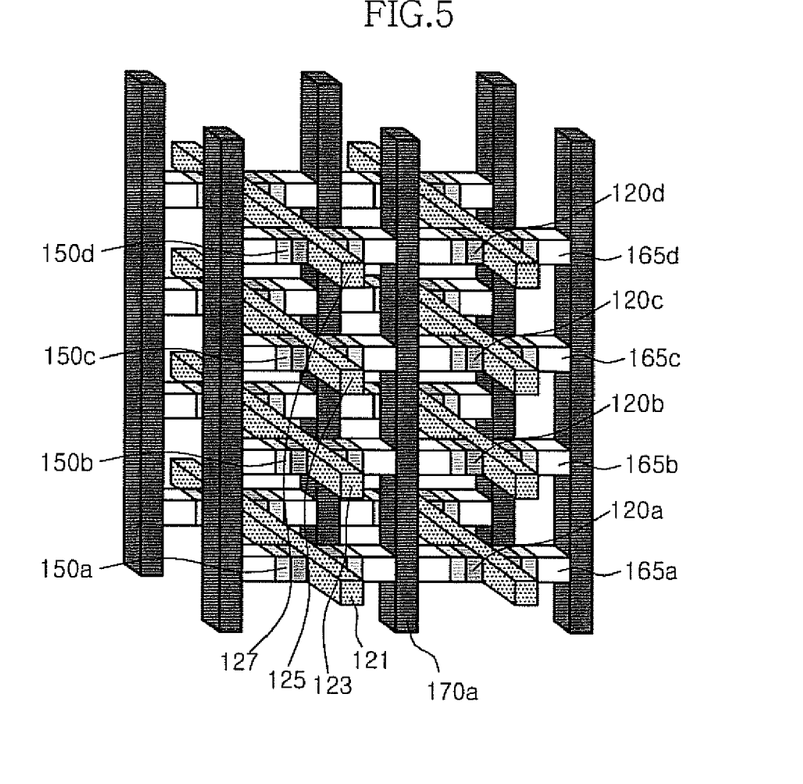
FIG. 5 is a perspective view of a semiconductor memory device according to another exemplary embodiment.
Figure 6:
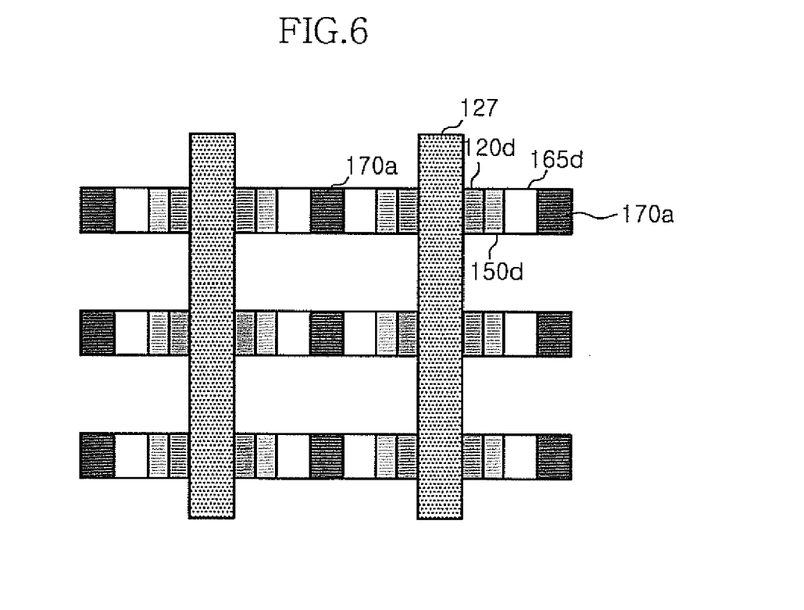
FIG. 6 is a plan view of the semiconductor memory device of FIG. 5.
Figure 7:
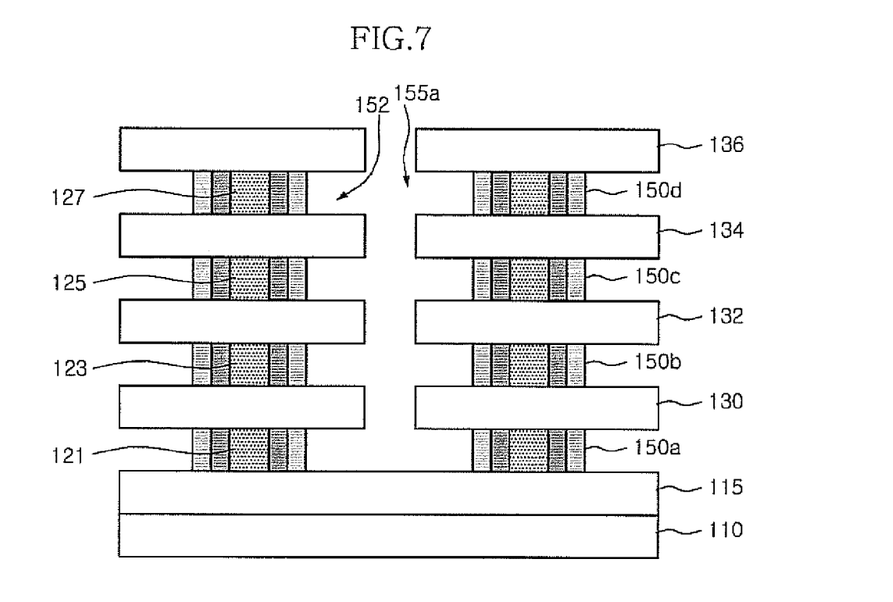
FIGS. 7 and 8 are cross-sectional views illustrating semiconductor memory devices according to another exemplary embodiment.
Figure 8:
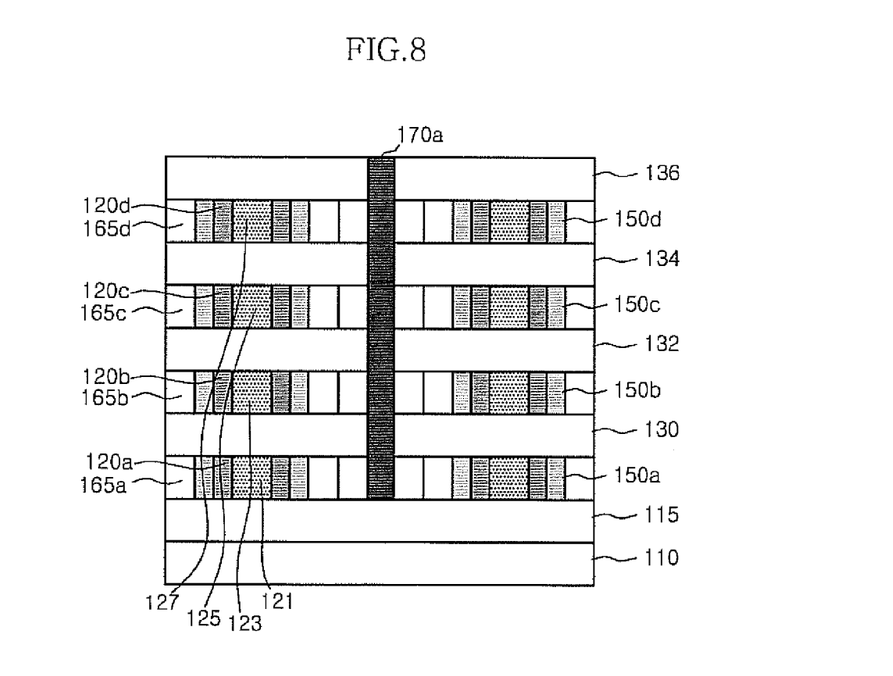

Referring to FIGS. 3D and 4D, resistive device layers 165a, 165b, 165c and 165d are formed to be buried within the first space 152 of respective layers. The resistive layers 165a, 165b, 165c and 165d may include a material layer of which a resistance is varied by applying a voltage or current. According to an example, the resistive layers 165a, 165b, 165c and 165d may be formed of a chalcogenide (GST) material or $TiO_2$ material. However, the inventive concept is not limited thereto and any material of which a resistance is varied may be used as the resistive device layer. A conduction layer (for example, a metal material layer) is buried within the second space 155 separated by the supporting pattern 145 to form word lines 170.

The word line 170 is in contact with the plurality of resistive device layer 165a, 165b, 165c and 165d and is used to perform memory operations.

In the semiconductor memory device, the supporting pattern 145 may not be formed when the first and second space 152 and 155 of FIGS. 3C and 4C are formed. In this case, as illustrated in FIGS. 5 to 8, a second space 155a in FIG. 7) has a narrower width than the second space 155 FIG. 4C. A metal material is buried in the second space 155a between column structures 140 to form a word line 170a. In the semiconductor memory device of the exemplary embodiment shown in FIGS. 5 to 8, three word lines are used to form two sets of word lines, where a center word of the three word lines is shared by the two sets.

In this embodiment, a device size is reduced by one word line pitch per every two word line sets, where a further reduction in the integration density can result.

In addition, in this embodiment, the word lines are arranged in both row and column directions so that even if only one word line is selected for a column and one word line is shared for the two word line sets as described above, memory operations may still be performed.

Figure 9:
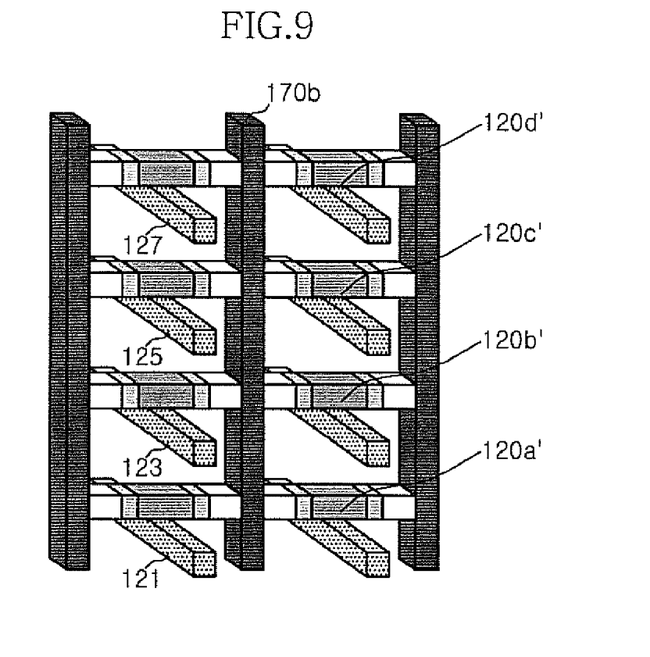
FIG. 9 is a perspective view illustrating a semiconductor memory device according to yet another exemplary embodiment.
Figure 10:
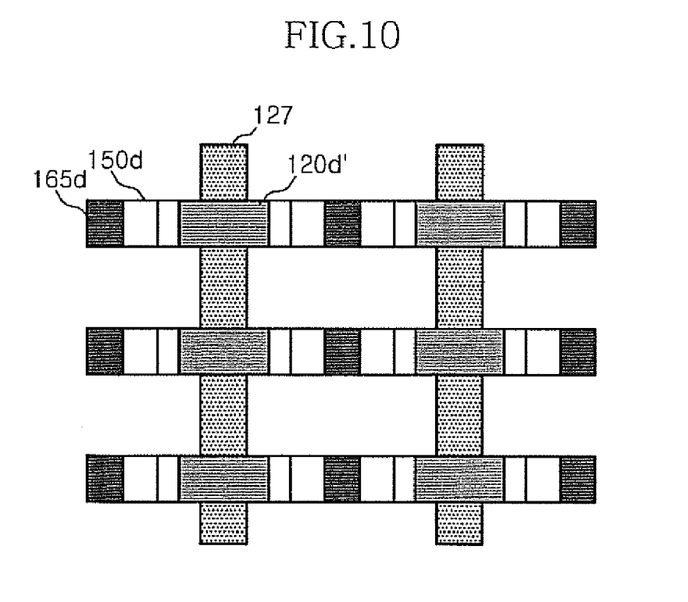
FIG. 10 is a plan view illustrating a semiconductor memory device according to yet another exemplary embodiment.
Figure 11:
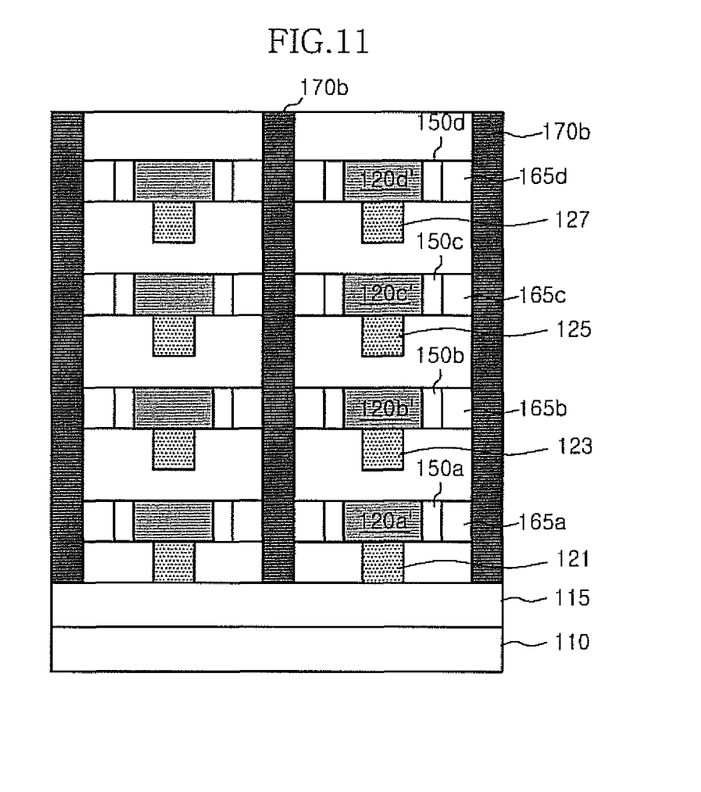
FIG. 11 is a cross-sectional view illustrating a semiconductor memory device according to yet another exemplary embodiment.

While the above exemplary embodiments show that the bit lines 121, 123, 125 and 127 are formed in a buried type, bit lines 121, 123, 125 and 127 may alternatively be disposed below first switching layers 120a', 120b', 120c' and 120d' as illustrated in FIGS. 9 to 11.

In this case, the bit line 121 is formed and then an insulating layer (not shown) is buried. Next, forming the first switching layer (for example, 120a') on the buried insulating layer and the bit line (for example, 121) and forming an interlayer insulating layer (for example, 130) may be repeatedly performed to form a stacked structure. After forming the structure, the processes for forming first and second spaces (not shown) are performed as described above.

Resistive device layers 165a, 165b, 165c and 165d are formed in the first space and word lines 170b are formed in the second space. In this embodiment, although a word line is illustrated as being shared, the word line may be formed in a form having a supporting pattern (for example, 145) as described above.

In an exemplary semiconductor memory device, between a pair of word lines 170 constituting of a set of word lines, opposing unit memory cells mc include the first switching layers 120a', 120b', 120c' and 120d', the second switching layers 150a, 150b, 150c and 150d disposed on each sidewall of the first switching layers 120a', 120b', 120c' and 120d' and the resistive device layers 165a, 165b, 165c and 165d formed between an outer sidewall of the second switching layers 150a, 150b and 150c and the word line 170b. In addition, the bit lines 121, 123, 125 and 127 are in contact with lower portions of the first switching layers 120a', 120b', 120c' and 120d', respectively, to control the unit memory cells mc. That is, the unit memory cells mc have a symmetrical structure with respect to first switching layers 120a', 120b', 120c' and 120d', and data is stored in the resistive device layer 165a, 165b, 165c and 165d, which are in contact with a corresponding word line 170b, according to driving of a selected word line of two word lines 170b on either sides of the first switching layers 120a', 120b', 120c' and 120d'.

Figure 12:
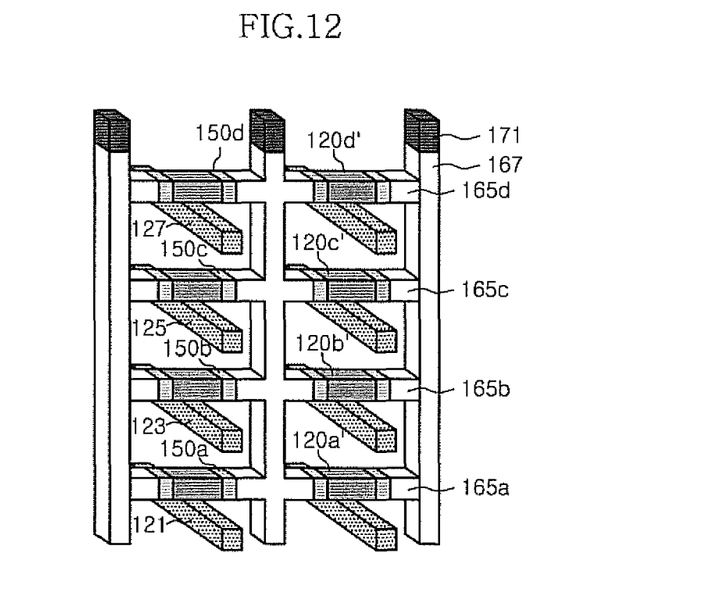
FIG. 12 is a perspective view illustrating a semiconductor memory device according to still another exemplary embodiment.
Figure 13:
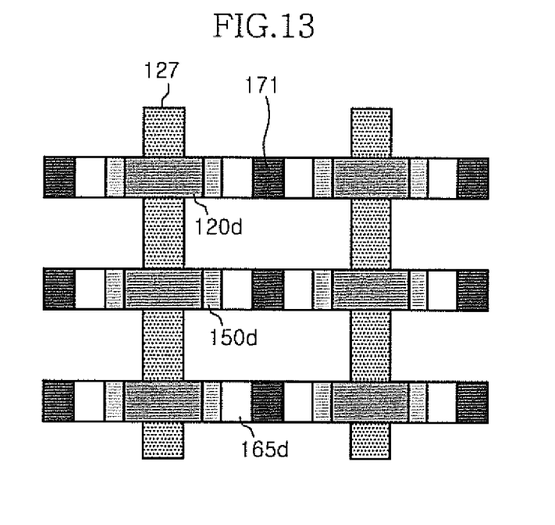
FIG. 13 is a plan view illustrating the semiconductor memory device according to the FIG. 12.
Figure 14:
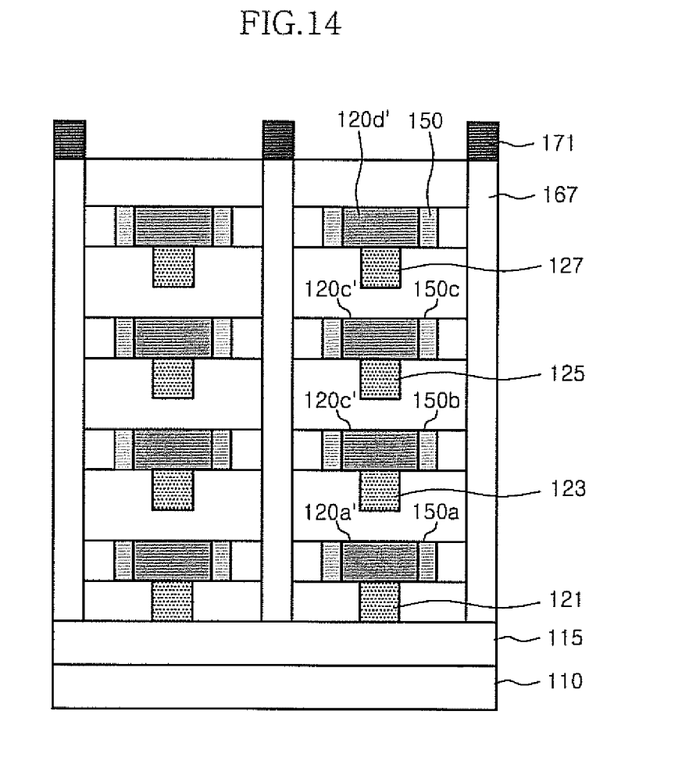
FIG. 14 is a cross-sectional view illustrating the semiconductor memory device according to the FIG. 12.

In addition, referring to FIGS. 12 to 14, a resistive device material may entirely fill the second space in which the word line 170a may be formed in other embodiments. The resistive device material may form a preliminary word line 167, and a metal word line 171 for electrical transmission formed of a metal is formed on the respective preliminary word line 167.

As described above, according to exemplary embodiments, word lines are formed perpendicular to the substrate surface, a plurality of bit lines are formed parallel to the substrate surface between a pair of word lines constituting a set of word lines, and the unit memory cells are formed between the adjacent ones of the word lines and the respective bit lines.

According to exemplary embodiments, sizes of the unit memory cells are determined by thicknesses of the first and second switching layers and the resistive device layer constituting the unit memory cells so that it is possible to easily control the size (contact area) of the unit memory cell.

In addition, unit memory cells may be stacked between a pair of word lines constituting a set of word lines so that the integration degree can be significantly improved within a defined space.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A semiconductor memory device, comprising:
a plurality of word lines vertically formed on a surface of a semiconductor substrate, wherein each pair of the plurality of word lines form a set of word lines;
a plurality of bit lines formed in parallel to the surface of the semiconductor substrate, wherein the bit lines are stacked over one another between the pair of word lines of one of the word line sets; and
unit memory cells disposed between respective ones of the bit lines and an adjacent one of the pair of word lines of said one of the word line sets,
wherein the unit memory cells each include:
a first switching layer formed to be in contact with the respective bit line;
a second switching layer formed on an outer sidewall of the first switching layer; and
a resistive device layer formed between the second switching layer and a corresponding word line.

2. The semiconductor memory device of claim 1, wherein the resistive device layer includes a material of which a resistance is varied according to an applied current or voltage.

3. The semiconductor memory device of claim 1, wherein the first switching layer is disposed on a sidewall of the respective bit line.

4. The semiconductor memory device of claim 1, wherein the second switching layer is disposed over the respective bit line.

5. The semiconductor memory device of claim 1, wherein the plurality of word lines are electrically insulated from each other.

6. The semiconductor memory device of claim 1, wherein the stacked bit lines are insulated from each other by an insulating layer.

7. The semiconductor memory device of claim 1, wherein word lines of two word line sets are configured to share one word line so that the word lines of two word line sets numbers three.

8. The semiconductor memory device of claim 1, wherein the word lines are formed of a metal material.

9. The semiconductor memory device of claim 1, wherein the word lines each include:
a resistive device pattern extending perpendicular to the surface plane of the semiconductor substrate; and
a metal pattern formed on the resistive device pattern.

10. The semiconductor memory device of claim 1, wherein the unit memory cells include a pair of memory cells disposed on either sides of a respective one of the bit lines and the respective bit line is disposed between the pair of word lines of said one of the word line sets.

11. The semiconductor memory device of claim 1, wherein a word line of one of the word line sets is separated by a supporting pattern from a word line of another one of the word line sets.

12. The semiconductor memory device of claim 1, wherein the first switching layer is a polysilicon layer of a first conductivity.

13. The semiconductor memory device of claim 12, wherein the second switching layer is a polysilicon layer of a second conductivity opposite to the first conductivity.

14. A semiconductor memory device, comprising:
a pair of word lines vertically formed on a surface of a semiconductor substrate;
a plurality of bit lines disposed parallel to the surface of the semiconductor substrate, wherein the bit lines are equally spaced from each other and stacked on one another between a pair of the word lines;
first unit memory cells formed between respective bit lines and a word line of the pair of word lines; and
second unit memory cells formed between respective bit lines and the other word line of the pair of word lines,
wherein the first unit memory cells and the second unit memory cells are elongated in parallel to the surface of the semiconductor substrate and perpendicular to the respective bit lines,
wherein at least one of the first and second unit memory cells includes:
a first switching layer formed to be in contact with the respective bit line and to be in contact with a bottom portion of the bit line;
a second switching layer disposed on an outer sidewall of the first switching layer; and
a resistive device layer formed between an outer sidewall of the second switching layer and an adjacent word line.

15. The semiconductor memory device of claim 14, wherein the first switching layer is disposed on one sidewall of the respective bit line.

* * * * *